(12) United States Patent
Basker et al.

(10) Patent No.: US 9,257,537 B2
(45) Date of Patent: Feb. 9, 2016

(54) FINFET INCLUDING IMPROVED EPITAXIAL TOPOLOGY

(71) Applicant: International Business Machines Corporation, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/141,575

(22) Filed: Dec. 27, 2013

(65) Prior Publication Data

US 2015/0187914 A1    Jul. 2, 2015

(51) Int. Cl.
| H01L 27/088 | (2006.01) |
| H01L 21/00 | (2006.01) |
| H01L 29/66 | (2006.01) |
| H01L 29/78 | (2006.01) |
| H01L 29/08 | (2006.01) |

(52) U.S. Cl.
CPC ...... *H01L 29/66795* (2013.01); *H01L 29/0847* (2013.01); *H01L 29/7851* (2013.01); *H01L 2029/7858* (2013.01)

(58) Field of Classification Search
CPC ............ H01L 29/66795; H01L 29/785; H01L 29/4238; H01L 29/0696; H01L 27/0207; H01L 27/1214; H01L 51/0545; H01L 27/12
USPC .......... 257/401, 206–206, E51.005, E33.005, 257/E21.09; 438/222, 226, 300, FOR. 163, 438/FOR. 174, FOR. 424
See application file for complete search history.

(56) References Cited

U.S. PATENT DOCUMENTS

| 7,352,034 | B2 | 4/2008 | Booth, Jr. et al. | |
| 8,268,729 | B2 | 9/2012 | Cheng et al. | |
| 8,367,556 | B1 | 2/2013 | Fuller et al. | |
| 8,455,364 | B2 | 6/2013 | Kanakasabapathy | |
| 2007/0170474 | A1* | 7/2007 | Kawasaki | 257/288 |
| 2009/0096002 | A1* | 4/2009 | Yu et al. | 257/308 |
| 2011/0049583 | A1* | 3/2011 | Lin et al. | 257/288 |
| 2011/0095378 | A1* | 4/2011 | Lee et al. | 257/401 |
| 2011/0204460 | A1* | 8/2011 | Wong et al. | 257/427 |
| 2011/0210404 | A1* | 9/2011 | Su et al. | 257/401 |
| 2012/0070947 | A1 | 3/2012 | Basker et al. | |

(Continued)

OTHER PUBLICATIONS

Lee et al., "Thermal annealing in hydrogen for 3-D profile transformation on silicon-on-insulator and sidewall roughness reduction," Journal of Microelectromechanical Systems, vol. 15, No. 2, 2006, pp. 338-343.
Tezuka et al., "{110}-facets formation by hydrogen thermal etching on sidewalls of Si and strained-Si fin structures," Applied Physics Letters, vol. 92, 2008, 191903, 3 pages.

(Continued)

*Primary Examiner* — Thao X Le
*Assistant Examiner* — Nduka Ojeh
(74) *Attorney, Agent, or Firm* — Cantor Colburn LLP; Vazken Alexanian

(57) ABSTRACT

A semiconductor device includes a semiconductor substrate having a plurality of semiconductor fins formed on an upper surface thereof. An epitaxial material is formed on the upper surface of the semiconductor substrate and on an outer surface of the semiconductor fins. The epitaxial material includes an epi upper surface having a lower region that contacts the semiconductor fins and an upper region formed above the lower region. The upper region extends parallel with an upper surface of the semiconductor fins.

11 Claims, 15 Drawing Sheets

(56) References Cited

U.S. PATENT DOCUMENTS

2012/0261726 A1* 10/2012 Yang et al. .................. 257/288
2012/0313170 A1  12/2012 Chang et al.
2013/0005103 A1   1/2013 Liu et al.

OTHER PUBLICATIONS

Tsai et al., "Pattern transfer of directed self-assembly (DSA) patterns for CMOS device applications", Proc. of SPIE, vol. 8685, Mar. 2013, 86850L, 9 pages.

* cited by examiner

FINFET INCLUDING IMPROVED EPITAXIAL TOPOLOGY

BACKGROUND

The present invention relates to semiconductor devices, and more specifically, to a semiconductor device including a smooth epitaxial topology.

Semiconductor fabrication processes utilize epitaxially grown material (i.e., epi) such as silicon doped with phosphorus (Si:P) or silicon germanium (SiGe), for example, to merge source/drain regions of semiconductor fins formed on a semiconductor substrate. During conventional epitaxial growth processes, the epi forms as facets on the sidewalls of the semiconductor fins, and may continue to grow at different and non-uniform rates depending on the direction of growth. The non-uniform growth rate of the epi typically results in a rough (i.e., corrugated) epitaxial topology. The rough epitaxial topography, however, can affect diffusion contact (CA) landing regions and can increase the fringing capacitance between the CA and the polysilicon (PC) control gate.

SUMMARY

According to at least one embodiment, a semiconductor device includes a semiconductor substrate having a plurality of semiconductor fins formed on an upper surface thereof. An epitaxial material is formed on the upper surface of the semiconductor substrate and on an outer surface of the semiconductor fins. The epitaxial material includes an epi upper surface having a lower region that contacts the semiconductor fins and an upper region formed above the lower region. The upper region extends parallel with an upper surface of the semiconductor fins.

A method of fabricating a semiconductor device includes forming a plurality of semiconductor fins on an upper surface of a semiconductor substrate. The method further includes growing an epitaxial material on the upper surface of the semiconductor substrate and on an outer surface of the semiconductor fins. The epitaxial material includes an epi upper surface having a lower region that contacts the semiconductor fins and an upper region formed above the lower region. The lower region and the upper region define a first height differential therebetween. The method further includes recessing the upper region to define a second height differential that is less than the first height differential to thereby increase the smoothness of the epi upper surface.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Figure 1:
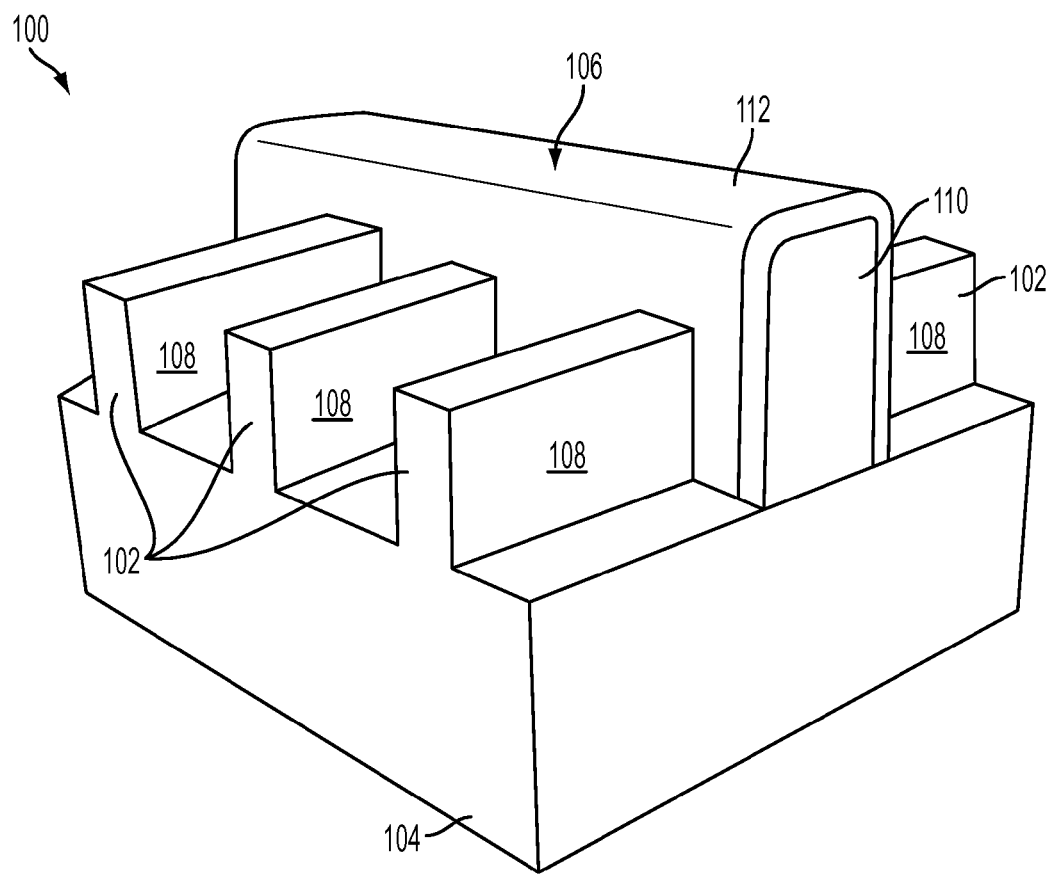
FIG. 1 illustrates a first orientation of a semiconductor device including a gate stack wrapping around a plurality of semiconductor fins formed on a semiconductor substrate.

With reference now to FIG. 1, a semiconductor device 100 is generally indicated. The semiconductor device 100 includes one or more semiconductor fins 102 formed on a semiconductor substrate 104 as understood by one of ordinary skill in the art. The semiconductor fins 102 and/or the semiconductor substrate 104 may be formed from various materials including, for example, silicon (Si). Although a bulk semiconductor substrate 104 is illustrated, it is appreciated that the semiconductor substrate 104 may be formed as a semiconductor-on-insulator (SOI) substrate as understood by those ordinarily skilled in the art.

The semiconductor device 100 further includes a gate stack 106 formed on the semiconductor fins 102. Source/drain regions 108 of the semiconductor fins 102 are therefore defined on the semiconductor fins 102 and at opposing sides of the gate stack 106. The gate stack 106 may include a gate element 110 and a spacer 112 formed on an outer surface of the gate element 110. The gate stack 106 may be formed from polysilicon (PC), for example. The spacer 112 may be formed from various materials including, but not limited to, silicon nitride (SiN).

Figure 2:
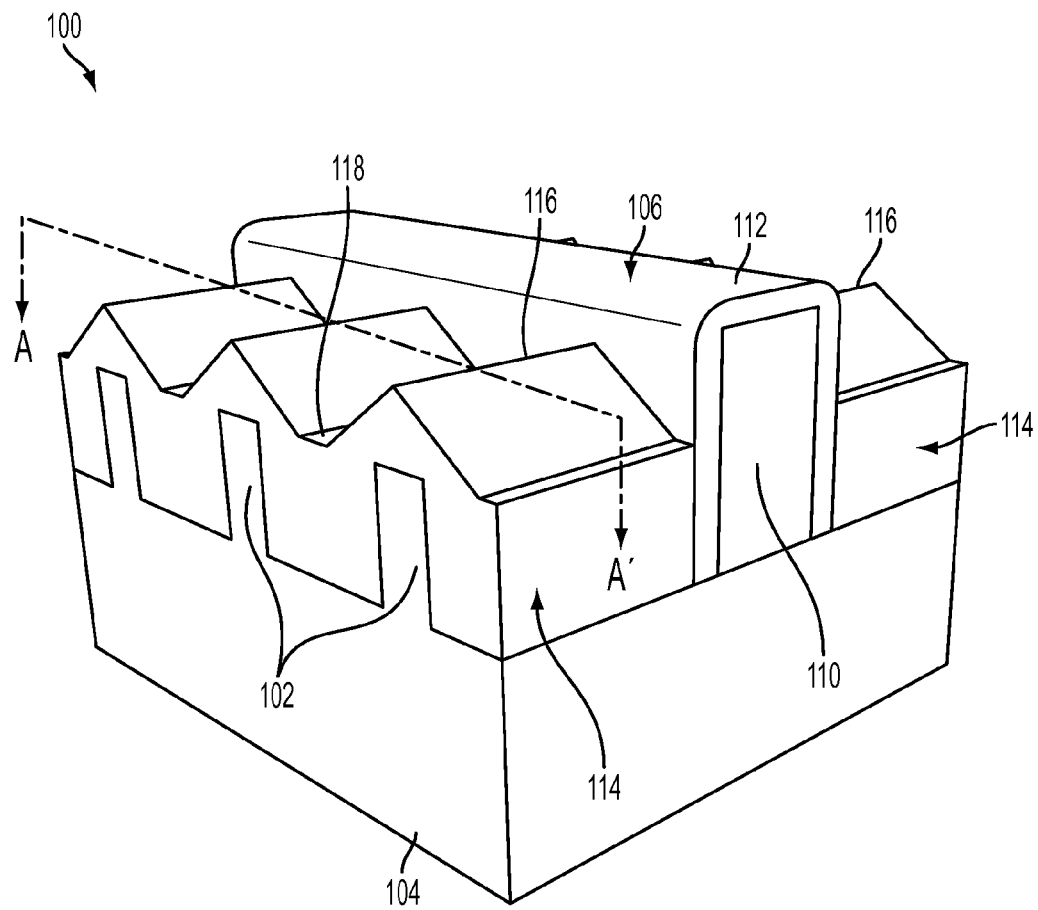
FIG. 2 illustrates the semiconductor device of FIG. 1 following growth of epitaxial material on the surfaces of the semiconductor fins and the semiconductor substrate to merge together the source/drain regions of the fins.
Figure 3:
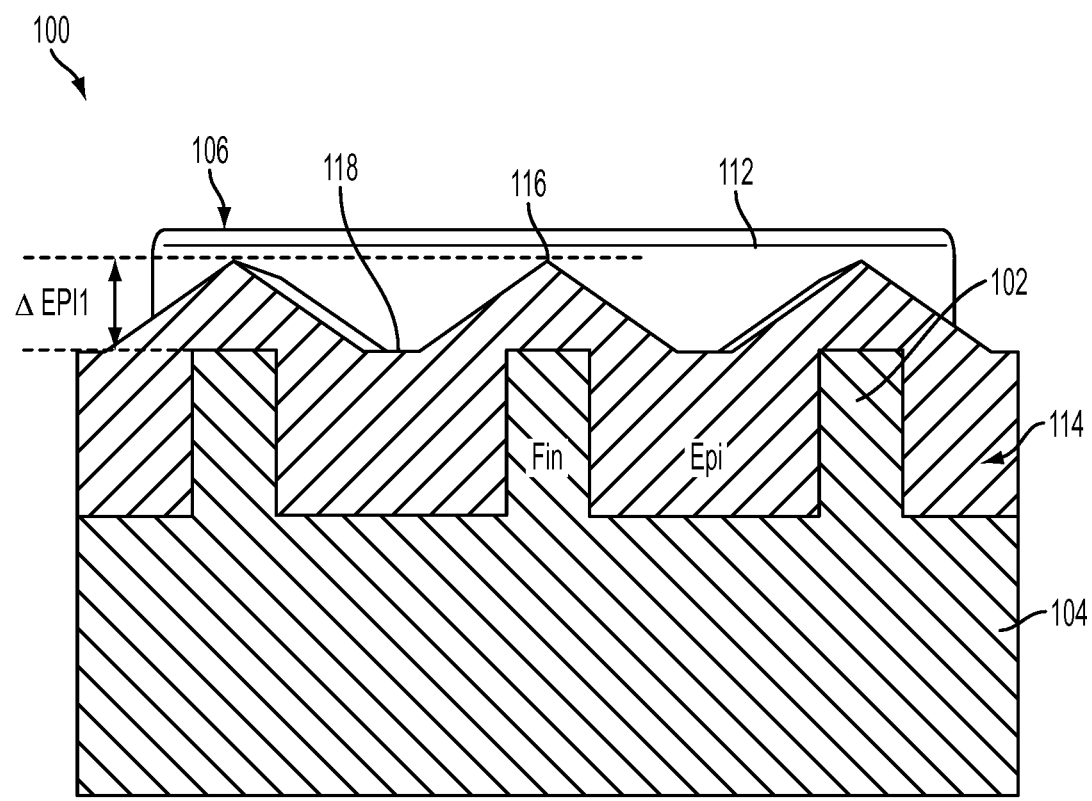
FIG. 3 is a cross-sectional view taken along line A-A' illustrating the semiconductor device of FIG. 2 according to a second orientation showing a corrugated upper surface of the epitaxial material.

Referring to FIGS. 2 and 3, an epitaxial material (epi) 114 is grown on the outer surfaces of the semiconductor fins 102 and a region of substrate located between the semiconductor fins 102. The epi 114 merges together the source/drain regions 108 of the semiconductor fins 102. Various methods for growing the epi 114 may be used as understood by those of ordinary skill in the art. The epi 114 may be comprise, for example, silicon doped with phosphorous (Si:P) and silicon germanium (SiGe).

The epi 114 includes an upper surface having a corrugated (i.e., rough) topography. The corrugated topography may include a series of peak regions 116 and trough regions 118 that extend along a width of the semiconductor device 100 (i.e., in a direction perpendicular to a length of the gate stack.) A height differential ($\Delta_{epi1}$) is defined by a distance between one or more trough regions 118 and one or more peak regions 116 as illustrated in FIG. 3. According to an exemplary embodiment, the $\Delta_{epi1}$ may range from approximately 15 nanometers (nm) to approximately 20 nm, for example.

Figure 4:
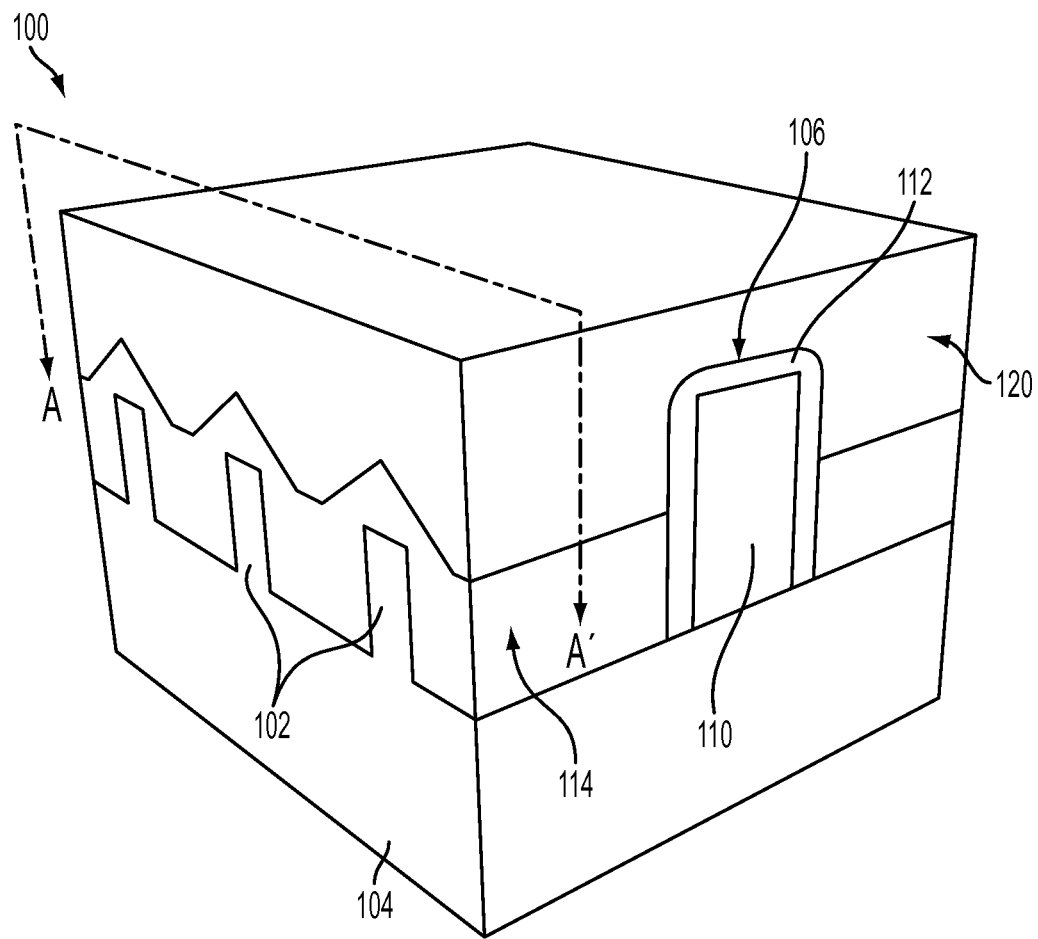
FIG. 4 illustrates the semiconductor device of FIGS. 2-3 according to the first orientation following deposition of an optical planarization layer that covers the upper surface of the epitaxial material.
Figure 5:
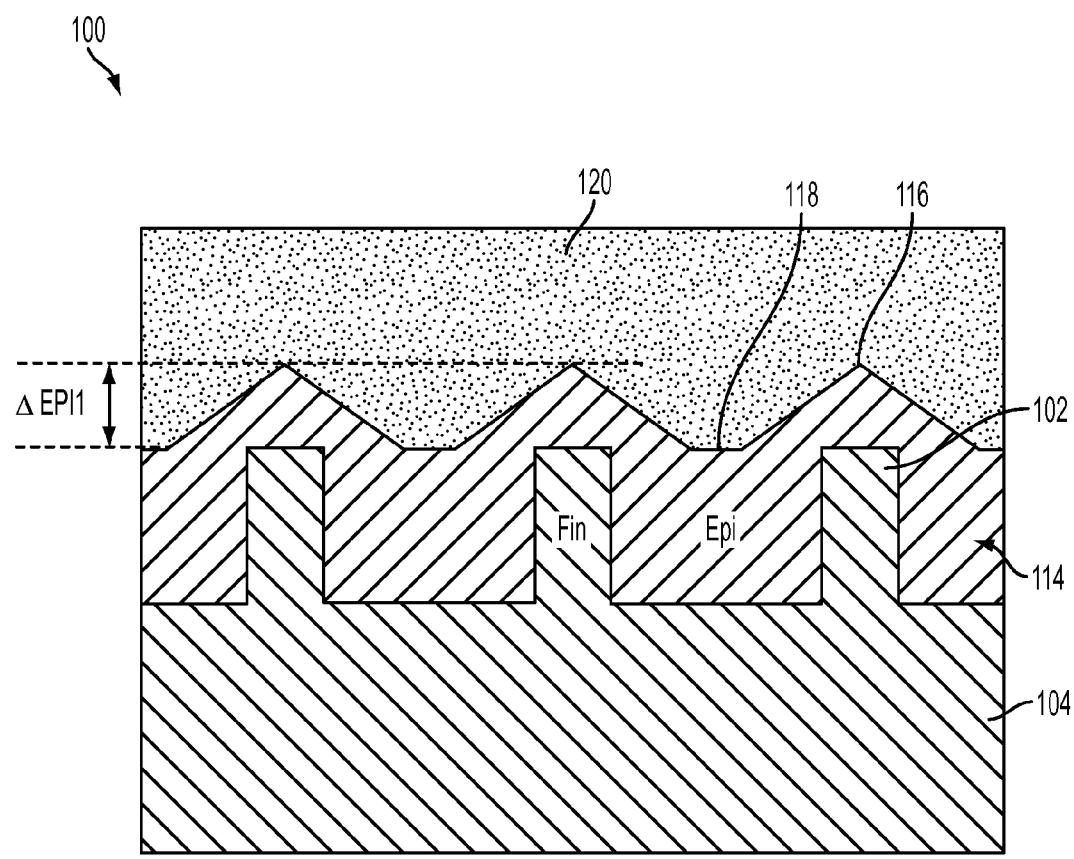
FIG. 5 illustrates the semiconductor device of FIG. 4 according to the second orientation.

Turning to FIGS. 4 and 5, an optical planarization layer (OPL) 120 is deposited on the upper surface of the epi 114 and covers the gate stack 106. According to at least one exemplary embodiment, the OPL 120 may be utilized to enable immersion lithography with a lens having a high numerical aperture, while minimizing reflectivity. The OPL 120 may be formed from an organic dielectric layer (ODL) material including, but not limited to, amorphous carbon, CHM701B which is commercially available from Cheil Chemical Co., Ltd., HM8006 and HM8014 which is commercially available from JSR Corporation, and ODL-102 which commercially available from ShinEtsu Chemical, Co., Ltd.

Figure 6:
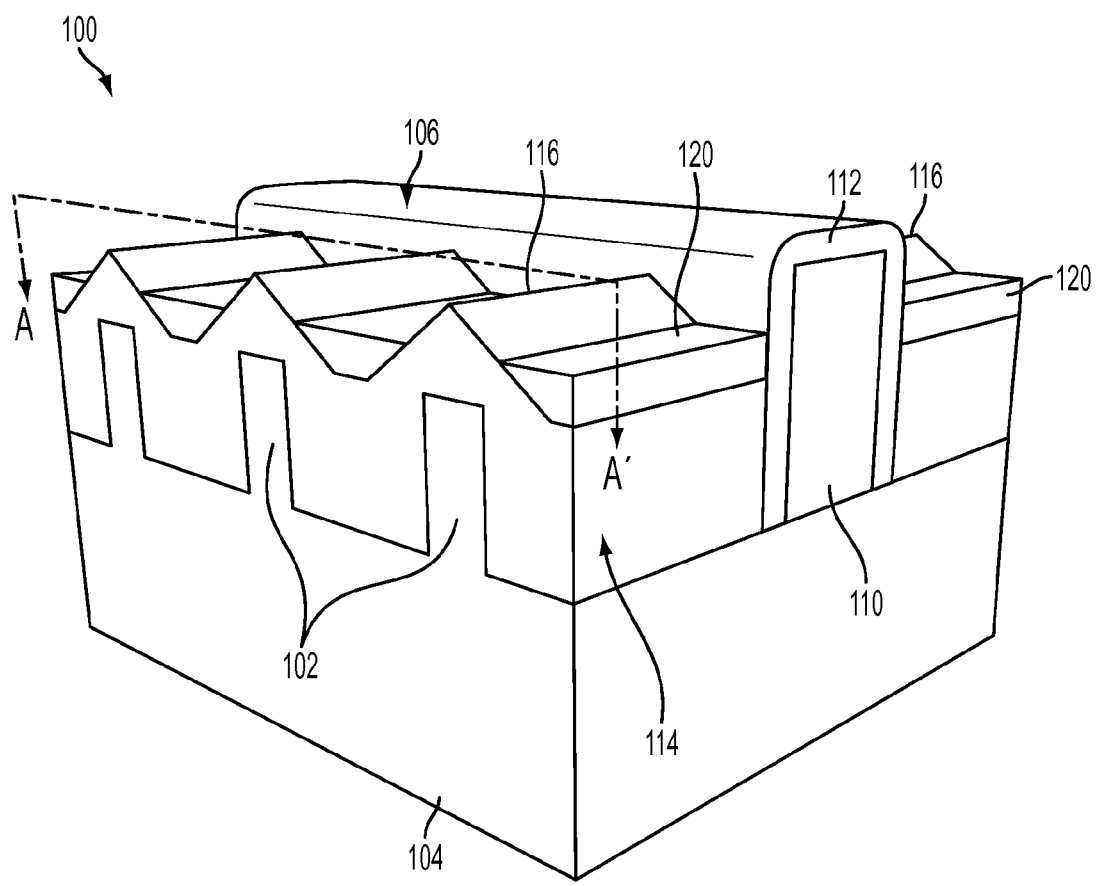
FIG. 6 illustrates the semiconductor device of FIGS. 4-5 according to the first orientation after partially recessing the optical planarization layer to expose an upper region of the epitaxial material.
Figure 7:
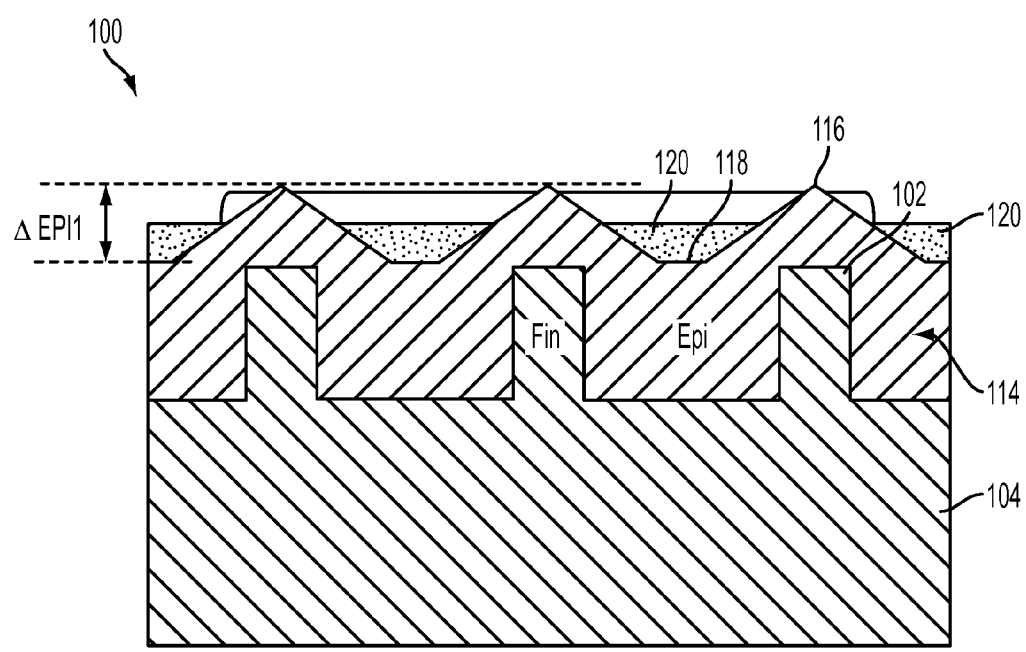
FIG. 7 illustrates the semiconductor device of FIG. 6 according to the second orientation.

Turning to FIGS. 6 and 7, the OPL 120 is recessed to expose an upper region, e.g., the peak regions 116, of the epi 114. Accordingly to at least one embodiment, the OPL 120 is partially recessed such that a residual amount of OPL remains formed in one or more trough regions 118. The OPL 120 may be recessed using a plasma ash etching process as understood by those ordinarily skilled in the art.

Figure 8:
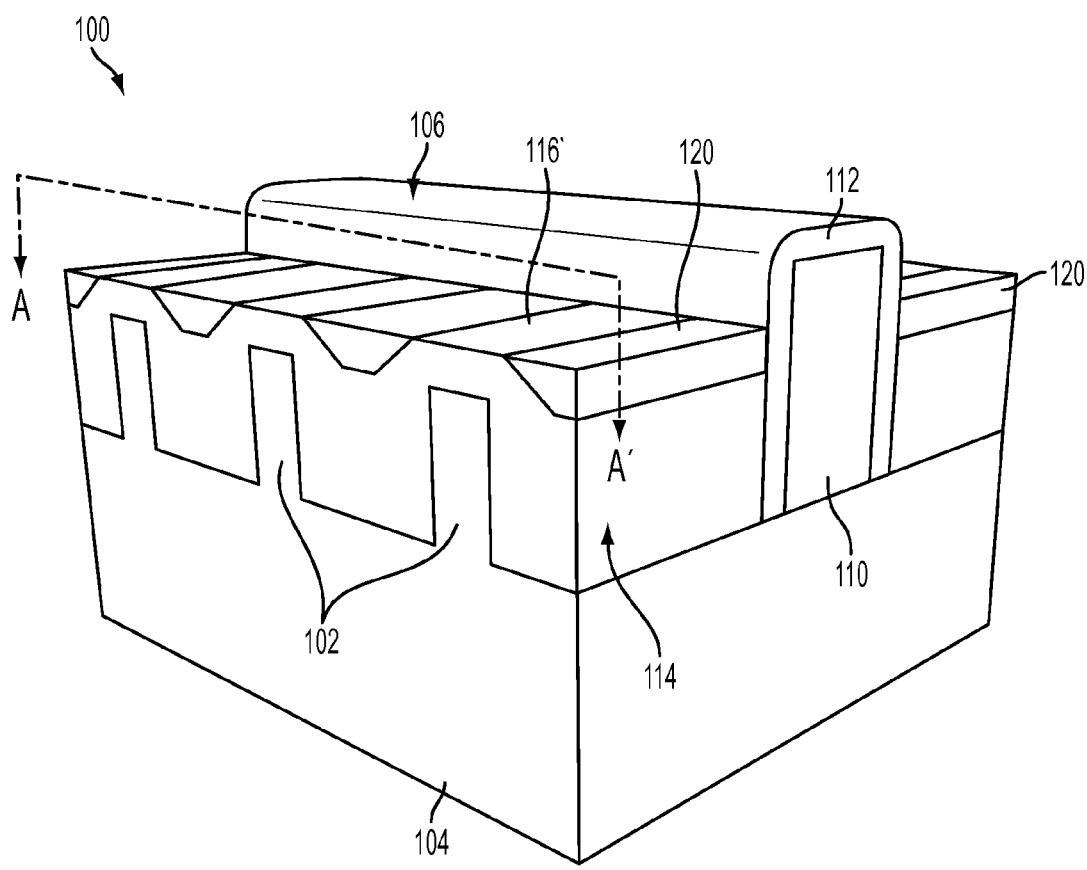
FIG. 8 illustrates the semiconductor device of FIGS. 6-7 according to the first orientation following an etching process that recesses the upper region of the epitaxial material to be flush with a remaining portion of the optical planarization layer.
Figure 9:
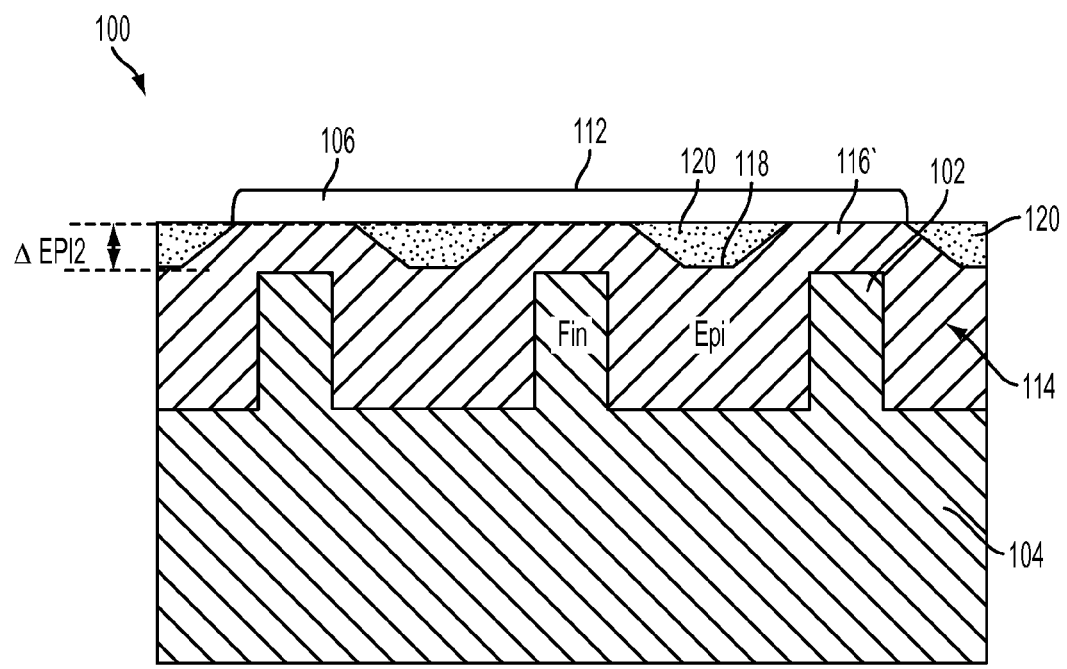
FIG. 9 illustrates the semiconductor device of FIG. 8 according to the second orientation.

Referring now to FIGS. 8 and 9, the epi 114 undergoes an etching process that recesses the upper region, e.g., the peak region 116 of the epi 114. In this regard, the flatness of the peak region 116 is increased, thereby increasing the overall flatness of the upper surface of the epi 114. The etching process is selective to the material of the spacer 112 (e.g., SiN) and the OPL 120. According to at least one embodiment, the etching process stops on the OPL 120 such that the recessed upper region 116', e.g., the recessed peak region 116', of the epi 114 is flush with a remaining portion of the OPL 120. In this regard, the adjusted height of the epi 114 due to the recessing process may be controlled according to the amount of recessed OPL 120 remaining on the epi 114. Accordingly, the distance between one or more trough regions 118 and one or more recessed peak regions 116' defines a new height differential ($\Delta_{epi2}$). The $\Delta_{epi2}$ between the recessed peak region 116' of the epi 114 and the trough region 118 may range from approximately 3 nm to approximately 10 nm. According to at least one embodiment, the $\Delta_{epi2}$ may be half of $\Delta_{epi1}$ (i.e., $\Delta_{epi1}/2$).

Figure 10:
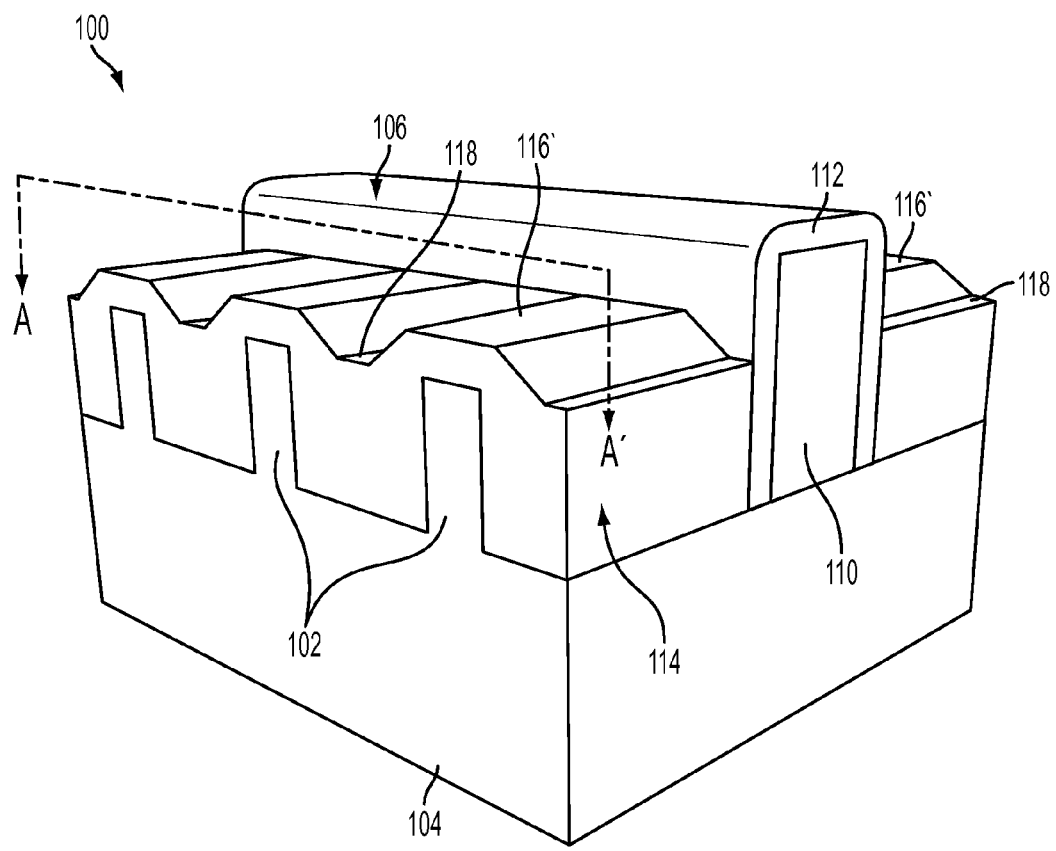
FIG. 10 illustrates the semiconductor device of FIGS. 8-9 according to the first orientation after removing the remaining portion of the optical planarization layer from the epitaxial material.
Figure 11:
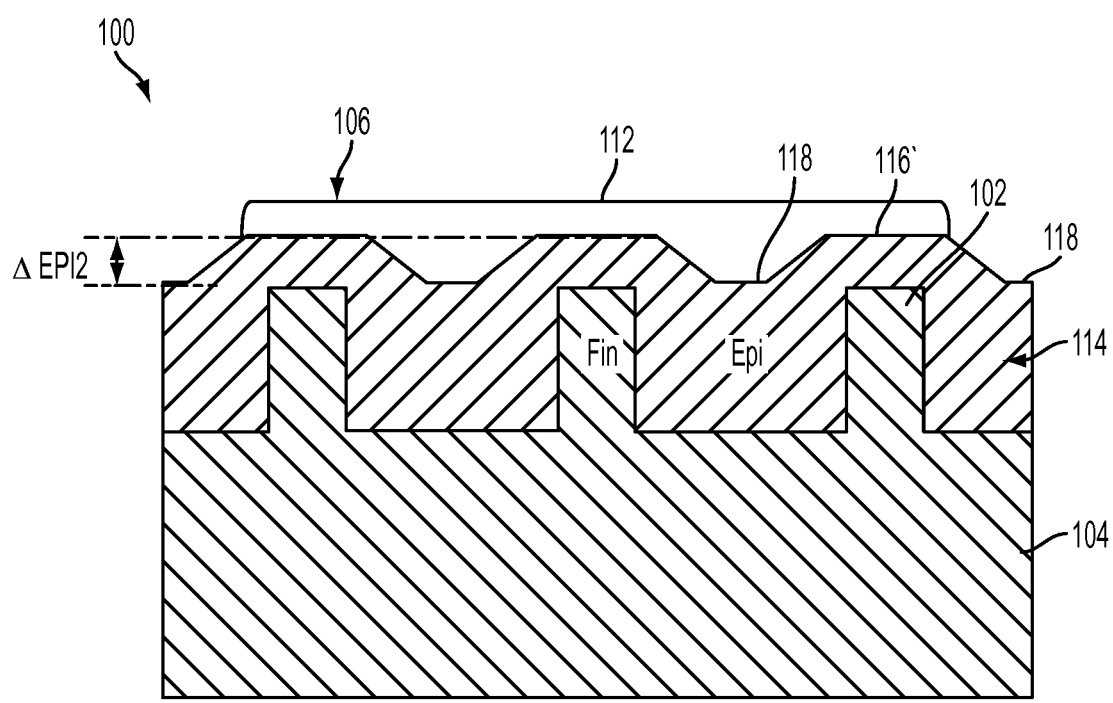
FIG. 11 illustrates the semiconductor device of FIG. 10 according to the second orientation showing the upper region of the epitaxial material having a reduce height and increased flatness.

Referring to FIGS. 10 and 11, the remaining portion of the recessed OPL 120 is striped from the epi 114. Various etching processes such as a plasma ash etching process, or a wet HF etch, for example, may be used to strip the remaining portion of the OPL 120. The plasma ash etching process may be selective to both the material of the spacer 112 and the epi 114. Accordingly, the epi 114 is maintained, and includes a recessed upper region, i.e., the recessed peak portion 116', which includes a flattened portion that extends parallel with an upper surface of the semiconductor fins 102.

Figure 12:
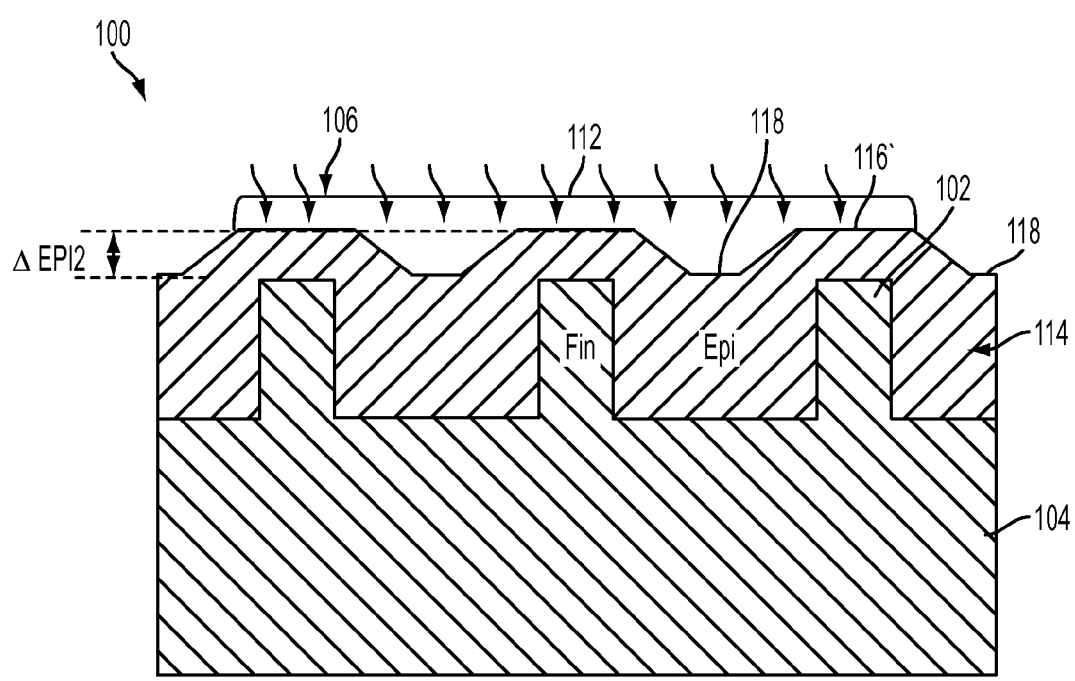
FIG. 12 illustrates the semiconductor device of FIGS. 10-11 according to the first orientation while undergoing an annealing process.

Referring to FIG. 12, the semiconductor device 100 is illustrated undergoing a thermal annealing process. The annealing process may include exposing the semiconductor device 100 to heated hydrogen gas ($H_2$) over a selected time period. The temperature of the $H_2$ gas may range from approximately 750 degrees centigrade (° C.) to approximately 800° C., and the time period may range from approximately 30 seconds to approximately 60 seconds.

Figure 13:
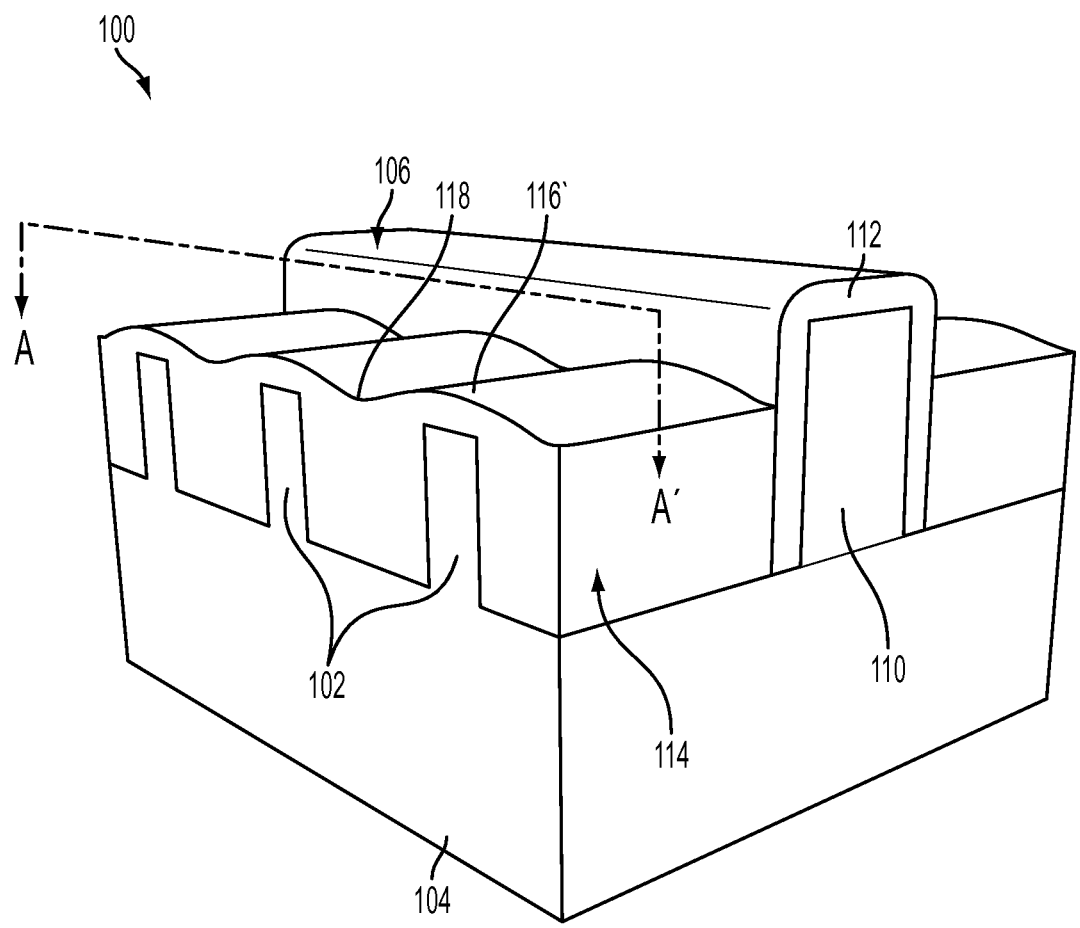
FIG. 13 illustrates the semiconductor device of FIG. 12 according to the first orientation following the anneal processes that increases the smoothness of the upper region of the epitaxial material.
Figure 14:
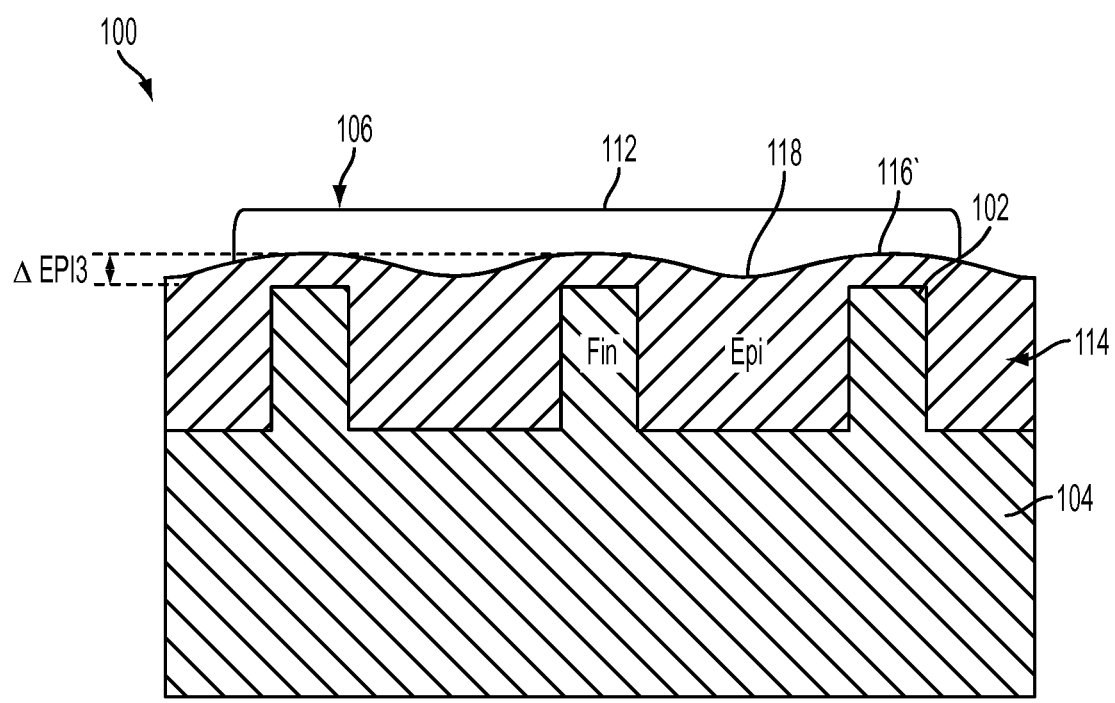
FIG. 14 illustrates the semiconductor device of FIG. 13 according to the second orientation.

Referring to FIGS. 13 and 14, the semiconductor device 100 is illustrated following the thermal annealing processes. In response to the annealing process, the height of the recessed upper region, i.e., the peak region 116', of the epi 114 is further reduced thereby defining a third height differential ($\Delta_{epi3}$) between the tough regions 118 and the etched peak region 116'. The $\Delta_{epi3}$ between the etched peak region 116' and the trough region 118 may range from approximately 1 nm to approximately 5 nm. In this regard, the flatness of the upper surface of the epi 114 is further increased such that the upper surface of the epi 114 is smoothened. According to at least one exemplary embodiment, the annealing process forms a wave-shape on the upper surface of the epi 114 that defines a smooth upper surface of the epi 114. The wave-shape upper surface extends continuously between opposing ends of the semiconductor device 100. Thus, unlike conventional fabrication processes which fail to adequately smooth the upper surface epi 114 due to the excessive thickness (e.g., approximately 15 nm or greater) of the epi 114, at least one embodiment of the present teachings provides a new and unexpected result of increasing the smoothness of the upper surface of the epi 114 in response to applying a thermal annealing process to epi 114 having a reduced $\Delta_{epi}$ of approximately 10 nm or less, for example.

Figure 15:
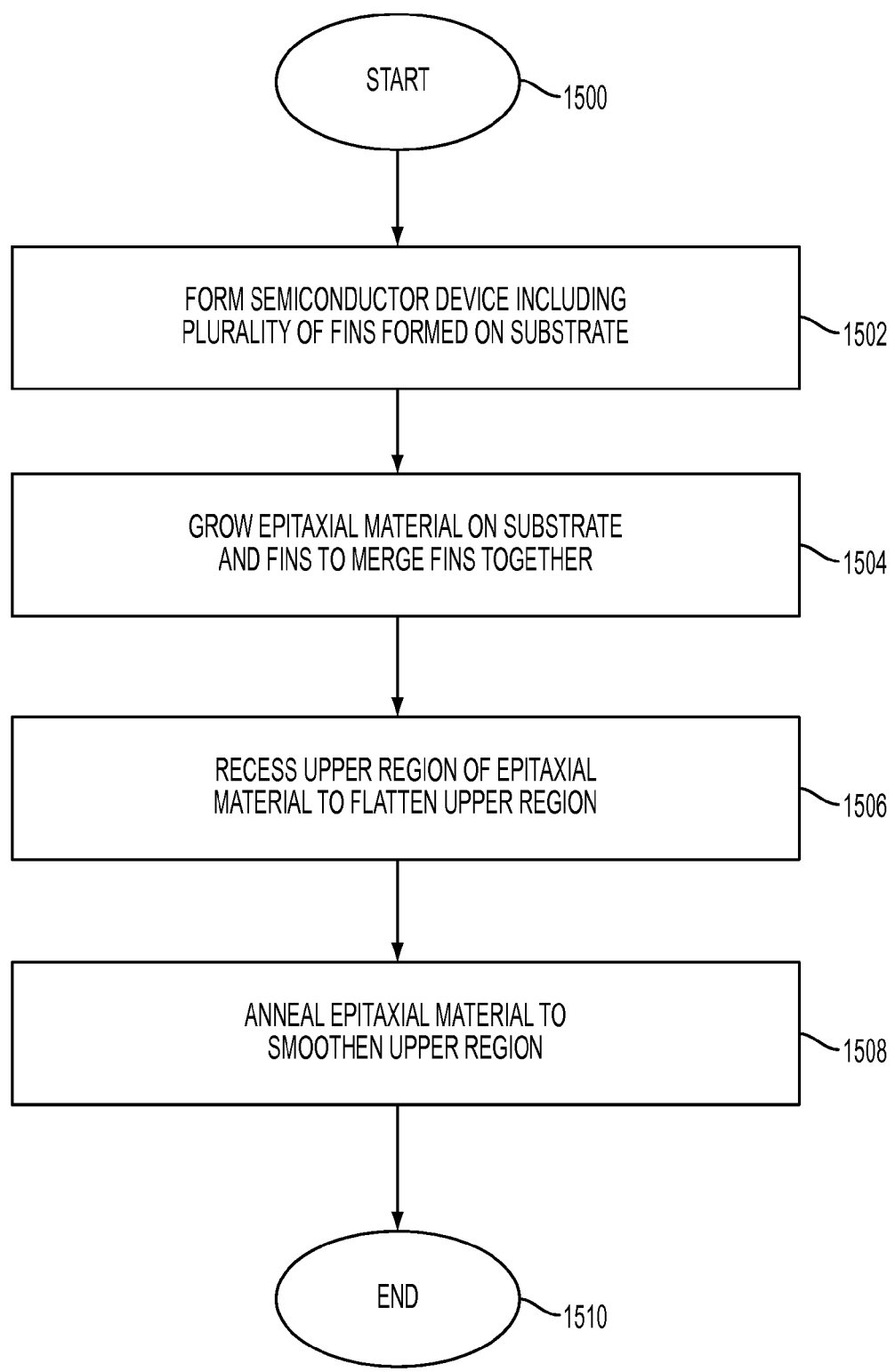
FIG. 15 is a flow diagram illustrating a method of fabricating semiconductor device according to an exemplary embodiment.

Turning now to FIG. 15, a flow diagram illustrates a method of fabricating semiconductor device 100 according to an exemplary embodiment. The method begins at operation 1500, and proceeds to operation 1502 where a semiconductor device is formed. The semiconductor device includes a plurality of semiconductor fins formed on an upper surface of a semiconductor substrate. The semiconductor device may further include a gate stack that wraps around a portion of the semiconductor fins to form a gate channel that is interposed between opposing source/drain regions of the semiconductor fins. At operation 1504, an epitaxial material is grown on the upper surface of the semiconductor substrate and on an outer surface of the semiconductor fins corresponding to the source/drain regions. The epitaxial material comprises an epi upper surface including a lower region that contacts the semiconductor fins and an upper region formed above the lower region. The lower region and the upper region define a first height differential therebetween. At operation 1506, the upper region of the epitaxial material is recessed to define a second height differential that is less than the first height differential. Accordingly, the flatness of the upper region of the epi is increased with respect to the previous non-recessed upper region. At operation 1508, the epi upper surface is annealed such that a height of the upper region is reduced to define a third height differential that is less than the second height differential and to increase the smoothness of the epi upper surface, and the method ends at operation 1510. Accordingly, the smoothness of the epi upper surface is increased with respect to the previous non-annealed epi upper surface.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of fabricating a semiconductor device, the method comprising:
    forming a plurality of semiconductor fins having a fin height on an upper surface of a semiconductor substrate;
    growing an epitaxial material on the upper surface of the semiconductor substrate and on an outer surface of the semiconductor fins, the epitaxial material including an epi upper surface having a lower region that contacts the semiconductor fins and an upper region formed above the lower region, the lower region and the upper region defining a first height differential therebetween;
    recessing the upper region to define a second height differential that is less than the first height differential and to increase the flatness of the epi upper surface without reducing the fin height, wherein recessing the upper region forms a plurality of recessed peak regions having an increased flatness with respect to the upper region before the recessing is performed; and
    annealing the epi upper surface after the recessing of the upper region such that a height of the upper region is reduced to define a third height differential that is less than the second height differential, the annealing smoothening the recessed upper region to form a smoothened upper surface extending continuously between opposing ends of the semiconductor device.

2. The method of claim 1, wherein the second height differential ranges from 3 nanometers to 10 nanometers.

3. The method of claim 1, wherein the annealing smoothens the epi upper surface to form a wave-shape extending continuously between opposing ends of the semiconductor device.

4. The method of claim 3, wherein the third height differential ranges from 1 nanometer to 5 nanometers.

5. The method of claim 4, further comprising depositing an optical planar layer on the epi upper surface of the epitaxial material before recessing the upper region and recessing the optical planar layer to expose the upper region.

6. The method of claim 5, wherein the recessing includes recessing the epi upper surface such that the recessed peak region is flush with the optical planar layer.

7. The method of claim 6, wherein a height of the optical planar layer controls a height of the recessed peak region.

8. The method of claim 7, wherein the annealing includes exposing the epitaxial material to heated hydrogen gas ($H_2$) after removing the optical planar layer.

9. The method of claim 8, wherein the semiconductor substrate is formed from silicon and the epitaxial material is formed from a material selected from a group comprising silicon germanium (SiGe), and silicon doped with phosphorus (Si:P).

10. The method of claim 9, further comprising forming a gate stack on the semiconductor device, the gate stack configured to wrap around a portion of each semiconductor fin among the plurality of semiconductor fins to define a respective gate channel region interposed between opposing source/drain regions of a respective semiconductor fin.

11. The method of claim 10, wherein the growing the epitaxial material includes growing the epitaxial material on the source/drain regions such that the plurality of fins are merged together.

* * * * *